United States Patent
Tsai (10) Patent No.: US 7,510,909 B2
(45) Date of Patent: Mar. 31, 2009

(54) FABRICATING METHOD OF WAFER PROTECTION LAYERS

(75) Inventor: Yu-Pin Tsai, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 420 days.

(21) Appl. No.: 11/162,606

(22) Filed: Sep. 16, 2005

(65) Prior Publication Data
US 2006/0057778 A1    Mar. 16, 2006

(30) Foreign Application Priority Data
Sep. 16, 2004    (TW) .............................. 93127970 A (51) Int. Cl.
*H01L 21/44*    (2006.01)
*H01L 21/48*    (2006.01)
*H01L 21/50*    (2006.01)

(52) U.S. Cl. ................ 438/114; 438/465; 257/E21.503

(58) Field of Classification Search ............... 438/33, 438/68, 113–114, 460, 462, 465; 257/E21.502, 257/E21.503
See application file for complete search history.

(56) References Cited

U.S. PATENT DOCUMENTS 6,326,698 B1 *    12/2001    Akram ..................... 257/781

* cited by examiner

*Primary Examiner*—Thanhha Pham
(74) *Attorney, Agent, or Firm*—Jianq Chyun IP Office (57) ABSTRACT

A fabricating method of wafer protection layers and a wafer structure are provided. The fabricating method includes providing a wafer first. The wafer includes pluralities of chips and has an active surface, a corresponding reverse surface and a plurality of pre-cut trenches on the active surface. On the active surface, pluralities of bumps are disposed. Next, a first curing-type protection layer and a pellicle are disposed over the active surface. Afterwards, the first curing-type protection layer is asked to contact the active surface. Besides, a second curing-type protection layer is disposed on the reverse surface. Afterward, the first and the second curing-type protection layer are cured. Finally, the wafer is cut through the pre-cut trenches to separate the chips from the wafer.

13 Claims, 6 Drawing Sheets

FABRICATING METHOD OF WAFER PROTECTION LAYERS

CROSS-REFERENCE TO RELATED APPLICATION

This application claims the priority benefit of Taiwan application serial no. 93127970, filed on Sep. 16, 2005. All disclosure of the Taiwan application is incorporated herein by reference.

BACKGROUND OF THE INVENTION

1. Field of Invention

The present invention relates to a fabricating method of wafer protection layers, and particularly to a fabricating method of wafer protection layers capable of enhancing chip production yield.

2. Description of the Related Art

The modern world is undergoing a fundamental society transformation with exploding information, wherein electronic products are everywhere and penetrating into our daily life. No matter what daily fields we are talking about, in all fields, such as food, apparel, housing, transportation, education and entertainment, we can find the immense applications of the products with IC (integrated circuit) components. Along with nonstop advance of electronic technology, the new generation products with more complex and more impersonated functions are kicked off. In terms of electronic product outlooks, it follows a stream of light-slim-short-compact. The modern semiconductor processes of chips are accordingly geared-up towards the main stream.

Normally, after completing a plurality of chips on a wafer, it needs to cut off the wafer for separating the chips, followed by packaging. During dicing a wafer and packaging chips however, the wafer and chips are likely to be polluted by the environmental moisture, dust and other impurities, even worse, the wafer surface is scratched. All these, such as oxidation caused by moisture, short-circuits contributed by dusts or open-circuits resulted by surface scratching would produce various defects with the delicate chips used in different kinds of circuits and lead the high-valued chips to be garbage. Besides, lots of debris generated during dicing a wafer is adhesive on the surface not only to pollute chips, but also to scratch the chip surface. The more chips discard, the more expensive is the production cost of chips. A possible detention delivering resulted by poor production outcome and re-scheduling the chip production even suffers the reputation of a manufacture. All of these negative results are certainly unwished-for by manufactures.

From the above described, how to overcome the defects in the chip process caused by dusting, polluting and scratching for enhancing the production yield of packaged chips is an extremely urgent project.

SUMMARY OF THE INVENTION

An object of the present invention is to provide a fabricating method of wafer protection layers suitable for protecting chip surfaces during the packaging and further for enhancing the production yield of packaged chips.

The present invention provides a fabricating method of wafer protection layers. At first, a wafer is provided, which includes a plurality of chips and has an active surface, a corresponding reverse surface and a plurality of pre-cut trenches on the active surface. On the active surface a plurality of bumps are disposed. Next, a first curing-type protection layer and a pellicle are disposed over the active surface. Then, the first curing-type protection layer contacts the active surface. Further, a second curing-type protection layer is disposed on the reverse surface of the wafer. Afterward, the first curing-type protection layer and the second curing-type protection layer are cured. Finally, the wafer is cut through the pre-cut trenches to separate the chips from the wafer. Wherein, the sequence of steps for disposing the second curing-type protection layer and the first curing-type protection layer with the pellicle are allowed to be adjusted depending on the need.

In the embodiment, the steps for disposing the first curing-type protection layer and the pellicle over the active surface can be, for example, the first curing-type protection layer is firstly disposed over the active surface, followed by disposing the pellicle on the first curing-type protection layer. Alternatively, the steps of disposing the first curing-type protection layer and the pellicle over the active surface can be, for example, disposing the first curing-type protection layer on the pellicle firstly, followed by disposing the first curing-type protection layer and the pellicle together over the active surface, and the first curing-type protection layer herein faces the active surface.

In addition, after disposing the second curing-type protection layer but prior to curing both the first curing-type protection layer and the second curing-type protection layer, for example, a step of removing the pellicle is further included. Alternatively, after making the first curing-type protection layer contact the active surface but prior to disposing the second curing-type protection layer, for example, a step of removing the pellicle is further included.

The method for the first curing-type protection layer to contact the active surface is, for example, laminating the pellicle. The material of the first curing-type protection layer and the second curing-type protection layer is, for example, acrylic, nonconductive material. The material of the first curing-type protection layer is, for example, transparent material or opaque material. Moreover, the material of the first curing-type protection layer and the second curing-type protection layer can be macromolecule material.

In addition, the pellicle can be an ultraviolet-curing pellicle. After disposing the second curing-type protection layer but prior to curing both the first curing-type protection layer and the second curing-type protection layer, for example, a step of ultraviolet-curing and removing the ultraviolet-curing pellicle is further included. Alternatively, after making the first curing-type protection layer to contact the active surface but prior to disposing the second curing-type protection layer, for example, a step of ultraviolet-curing and removing the ultraviolet-curing pellicle is further included.

In a short, with the fabricating method of wafer protection layers, since on both the active surface and the reverse surface of the chip, for example, curing-type protection layers, i.e. curing-type macromolecule material layers are disposed, the chip production yield after packaging is enhanced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1:
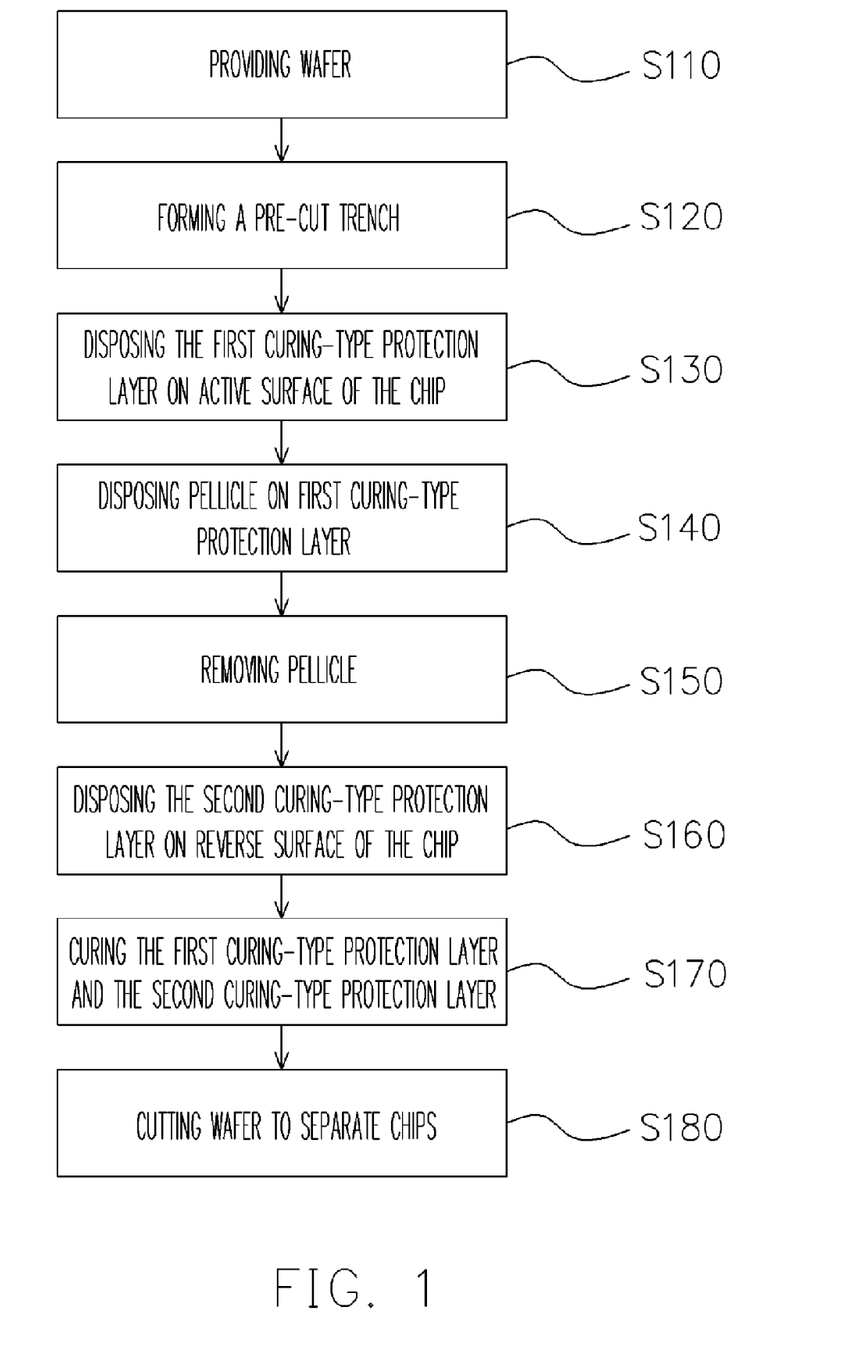
FIG. 1 is a block diagram showing a flowchart of a fabricating method of wafer protection layers provided by an embodiment of the present invention.

FIG. 1 is a block diagram showing a flowchart of a fabricating method of wafer protection layers provided by an embodiment of the present invention and FIGS. 2A~2G are section views showing the flowchart of the fabricating method of wafer protection layers in FIG. 1.

Figure 2A:
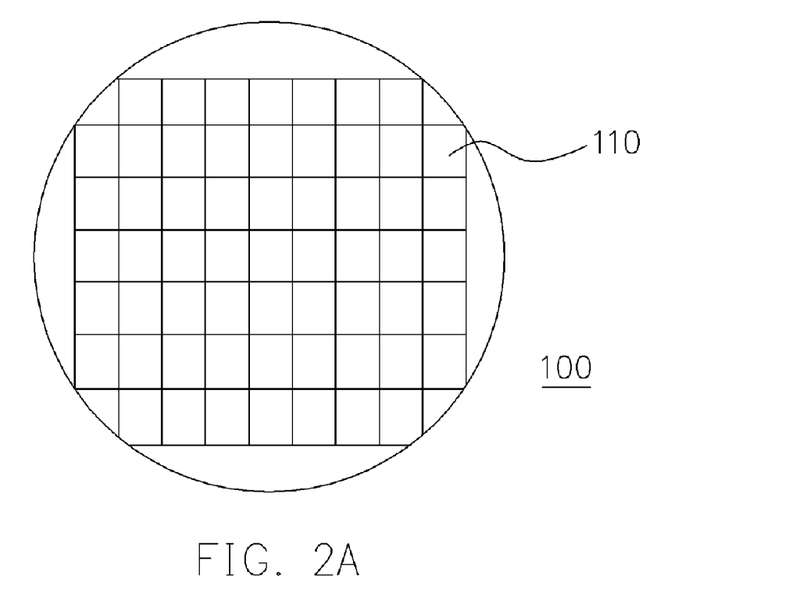
FIGS. 2A~2G are section views showing the flowchart of the fabricating method of wafer protection layers in FIG. 1.
Figure 2B:
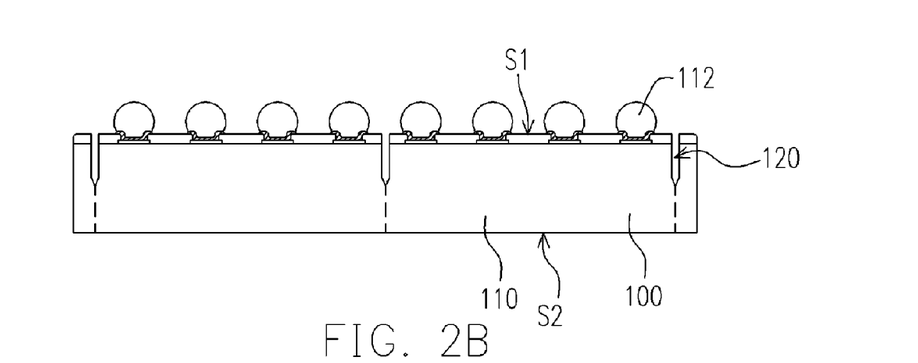

Referring to FIGS. 1 and 2A, a fabricating method of wafer protection layers provided by an embodiment of the present invention is begin with step S110 first, wherein a wafer 100 is provided. FIG. 2A is a schematic top view of the wafer 100. On the wafer 100 a plurality of chips 110 is formed. The wafer 100 is, for example, a silicon wafer commonly used in semiconductor industry. Continuing to FIGS. 1 and 2B, the wafer 100 has an active surface S1 and a corresponding reverse surface S2. In FIG. 2B only the partial wafer 100 with several chips is shown. On the active surface S1 a plurality of bumps 112 are disposed and used as electrically connecting paths between the circuit inside the chip 110 and other devices. Next at step S120, on the wafer 100, for example, a pre-cut trench 120 is formed. Alternatively, the pre-cut trench 120 was there on the wafer 100 already at step S110. Certainly, there can be another option, i.e., no pre-cut trench 120 on the wafer 100 at all. For some products, the pre-cut trench 120 is used for separating the chips 110 from each other.

Figure 2C:
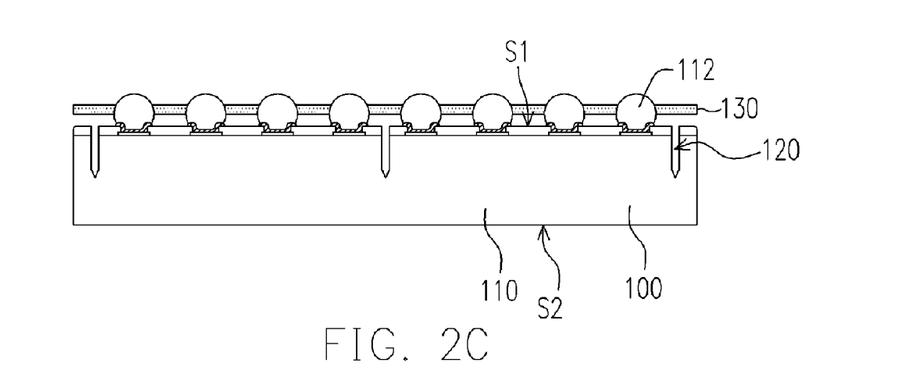
Figure 2D:
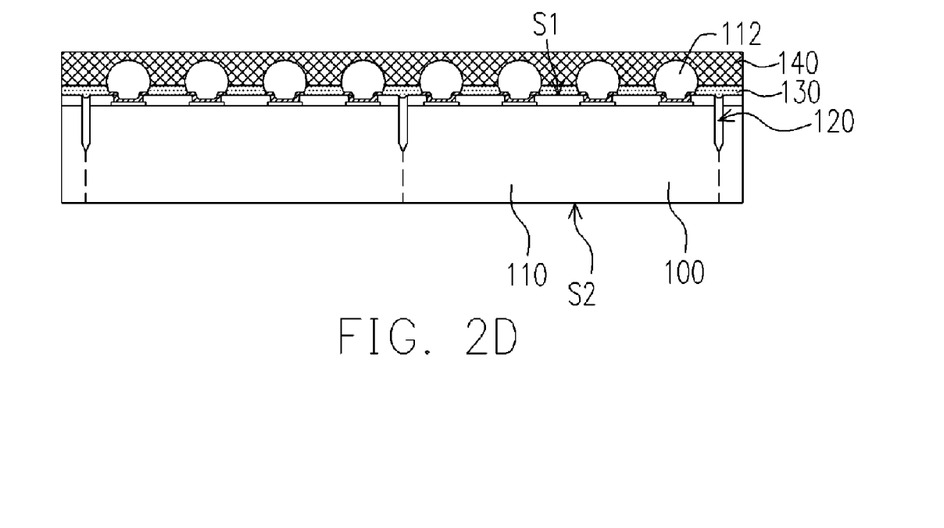

Afterwards, referring to FIGS. 1 and 2C, at step S130, a first curing-type protection layer 130 is disposed over the active surface S1 of the wafer 100, wherein the first curing-type protection layer 130 is not closely adhered on the active surface S1 of the wafer 100 yet. The first curing-type protection layers, is, for example, a curing-type macromolecule material layers and preferred to be made of acrylic nonconductive material. Further, referring to FIGS. 1 and 2D, at step S140, a pellicle 140 is disposed on the first curing-type protection layer 130, followed by making the first curing-type protection layer 130 contact the active surface S1. Since the pellicle 140 has a considerable thickness and is not likely to adhere to the machines herein, a laminating machine is employed to exert an appropriate force onto the pellicle 140, so that the first curing-type protection layer 130 is down-pressed and laminated onto the active surface S1. Meanwhile it is preferred the first curing-type protection layer 130 is not be remained on the bumps 112. Besides, the pellicle 140 is, for example, an ultraviolet-curing pellicle; so that the pellicle 140 is easily to be removed once the pellicle 140 is exposed to ultraviolet light.

The material of the first curing-type protection layer 130 can be opaque material. At the point, if a pre-cut trench 120 was formed on the wafer 100 already, as the first curing-type protection layer 130 is down-pressed by the pellicle 140 onto the active surface S1, a part of first curing-type protection layer 130 would be sunken into the pre-cut trench 120 and a dent is formed, as shown in a localized enlargement drawing of FIG. 2E. The dent can be used for alignment during cutting the wafer in the subsequent process. Certainly, the material of the first curing-type protection layer 130 can be transparent material either, wherein if a pre-cut trench 120 was formed on the wafer 100 already, the transparency of the first curing-type protection layer 130 is in favor of viewing the pre-cut trench 120 and helpful for alignment during cutting the wafer in the subsequent process.

Figure 2E:
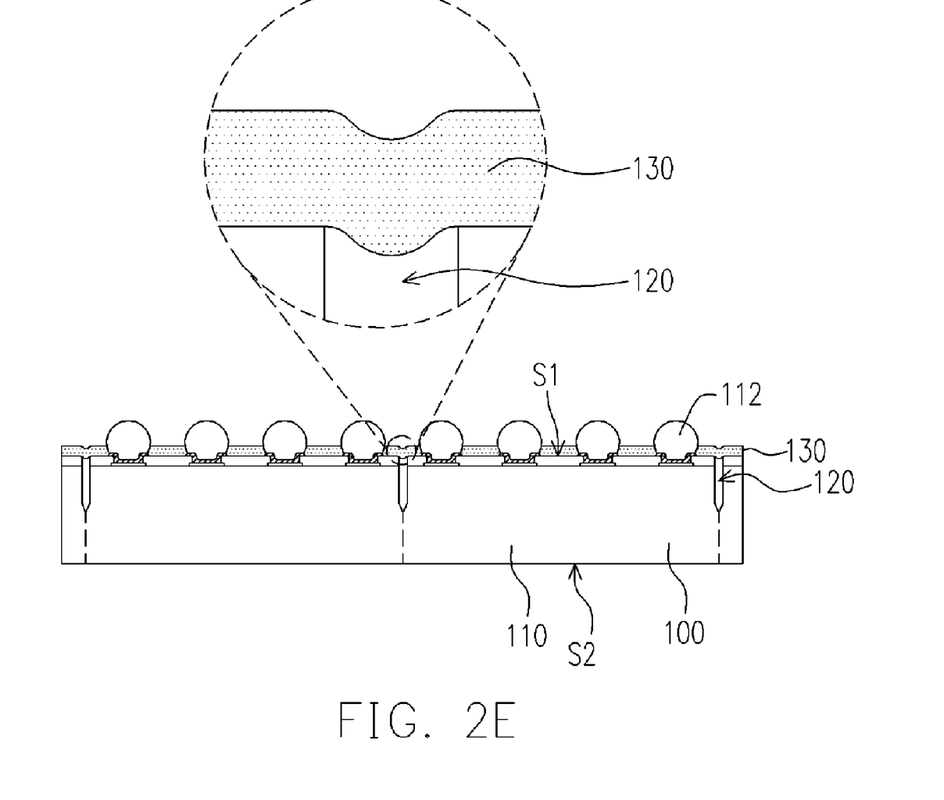

Furthermore, referring to FIGS. 1 and 2E, at step S150, the pellicle 140 is removed. The method for removing the pellicle 140 is, for example, irradiating the pellicle 140 with ultraviolet light and then removing the pellicle 140. In succession, referring to FIGS. 1 and 2F, at step S160, a second curing-type protection layer 150 is disposed on the reverse surface S2 of the wafer 100. The second curing-type protection layer 150 is, for example, a curing-type macromolecule material layer and preferred to be made of acrylic nonconductive material. The sequence of the processing steps can be changed depending on need. That is to say, the step S130 and S140 can be switched with the step S160. Thus, the step 160 for disposing the second curing-type protection layer 150 is prior to the step S130 and S140, where the first curing-type protection layer 130 and the pellicle 140 are disposed.

In the end, at step S170, the first curing-type protection layer 130 and the second curing-type protection layer 150 are cured. Besides, referring to FIGS. 1 and 2G, for example, the wafer 100 is cut off to separate chips 110 from the wafer 100 after step 170.

The second curing-type protection layer 150 is used for transferring the stress produced during cutting the wafer 100 onto itself, the second curing-type protection layer 150, so that the warpage of the chip back caused by stress concentration can be avoided and the chips are further protected from laser damaging during the subsequent laser marking process.

Figure 3:
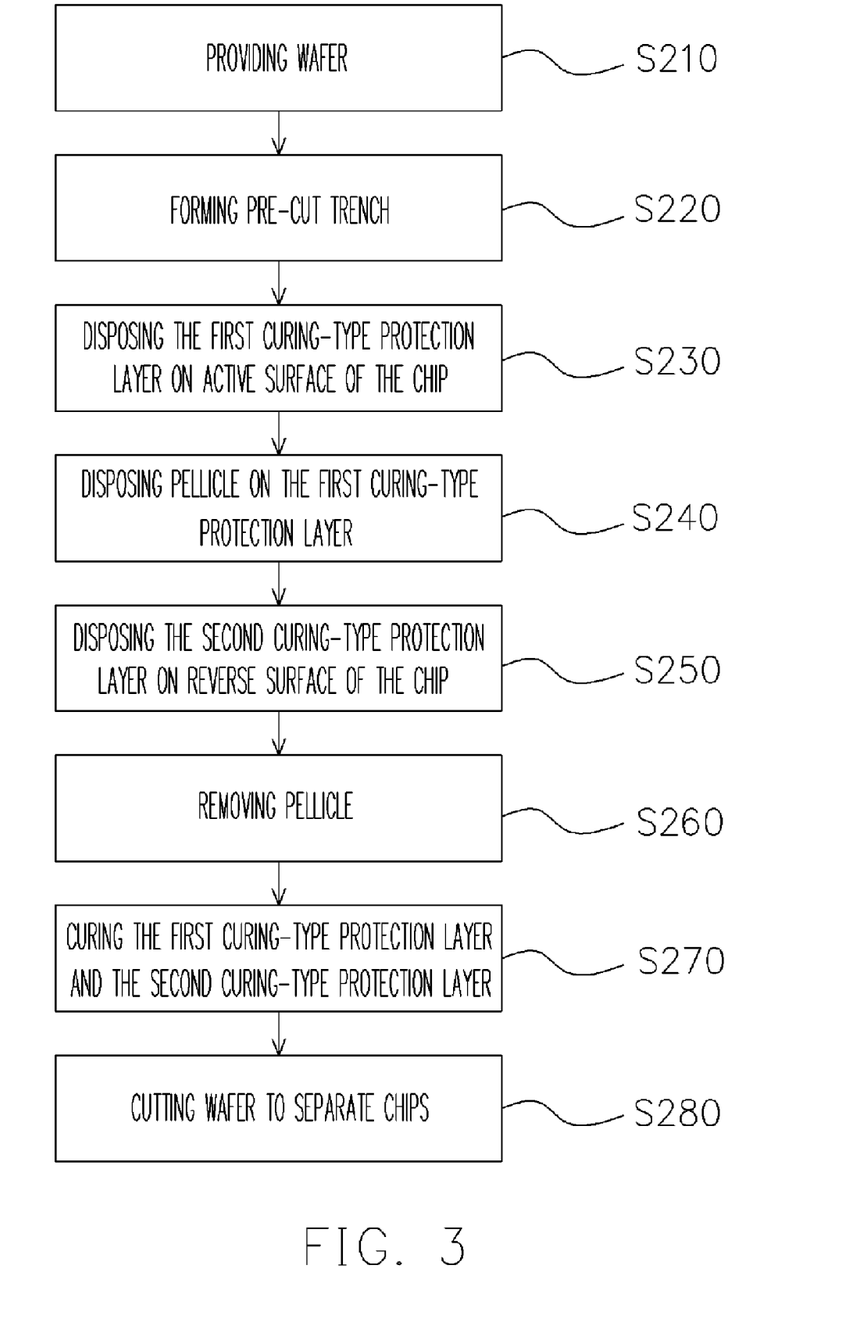
FIG. 3 is a block diagram showing a flowchart of a fabricating method of wafer protection layers provided by another embodiment of the present invention.
Figure 4A:
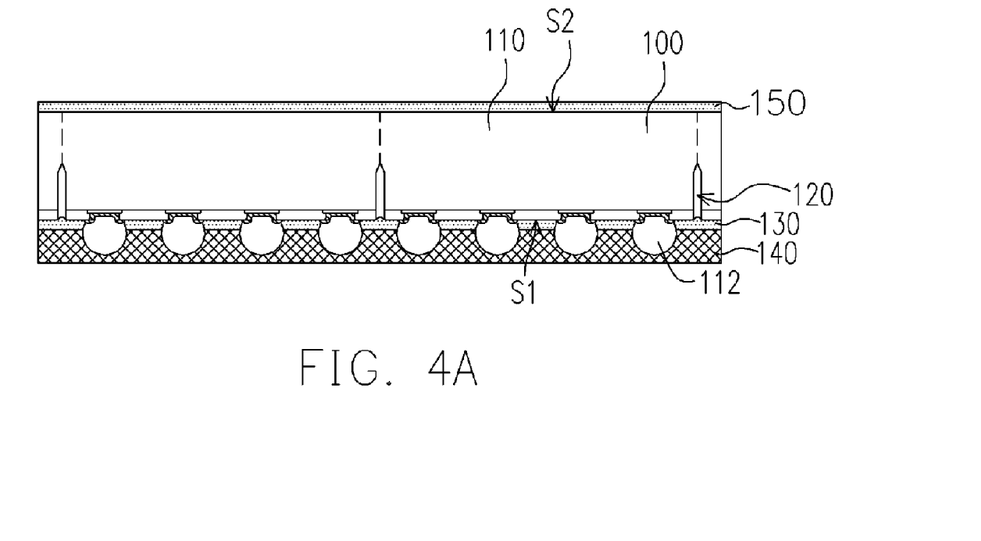
FIG. 4A and FIG. 4B are section views showing the flowchart of the fabricating method of wafer protection layers in FIG. 3.
Figure 4B:
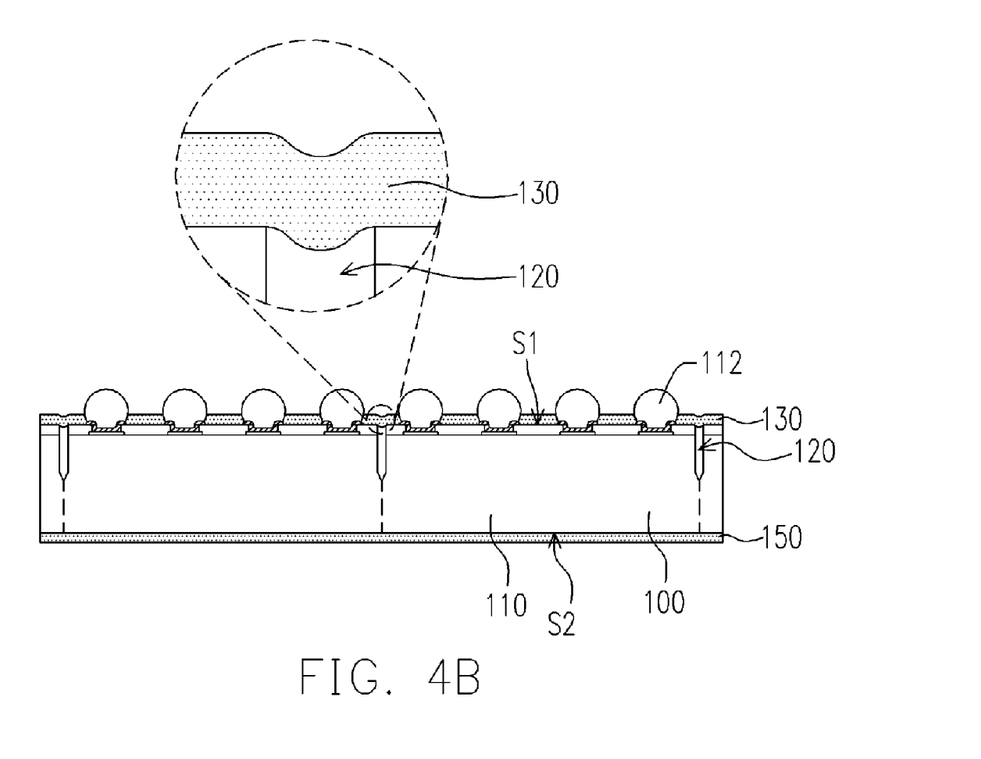

FIG. 3 is a block diagram showing a flowchart of a fabricating method of wafer protection layers provided by another embodiment of the present invention and FIG. 4A and FIG. 4B are section views showing the flowchart of the fabricating method of wafer protection layers in FIG. 3. Referring to FIGS. 3, 4A and 4B, the unique herein from the fabricating method of wafer protection layer shown in FIG. 1 is the sequence of step S250 and S260. Besides, the step S230 and S240 can be arranged after step S250 too.

In the fabricating method of wafer protection layers of FIG. 3, the second curing-type protection layer 150 is disposed on the reverse surface S2 of the wafer 100 first (step 250), followed by removing the pellicle 130 (step S260). The advantage thereof is that during disposing the second curing-type protection layer 150 the pellicle 140 is able to provide the bumps 112 with appropriate protection. The rest steps and the details in the fabricating method of wafer protection layers of FIG. 3 are the same as FIG. 1 and for simplicity, it is omitted to describe.

Remarkably, the fabricating method of wafer protection layers provided by the present invention doesn't limit the step sequence given by the above-described two embodiments in FIG. 1 and FIG. 3, where the first curing-type protection layer is disposed over the active surface first (step S130 and S230), then the pellicle is disposed on the first curing-type protection layer, followed by making the first curing-type protection layer contact the active surface (step S140 and S240). In more detail, in the fabricating method of wafer protection layers provided by the present invention, the first curing-type protection layer can be disposed on the pellicle first, then the first curing-type protection layer with the pellicle together are disposed on the active surface, followed by laminating the pellicle for the first curing-type protection layer to contact the active surface. No matter which step sequence is used, the final goal is the same that the first curing-type protection layer and the pellicle together are disposed on the active surface and then laminating is used for the first curing-type protection layer to contact the active surface.

Figure 2F:
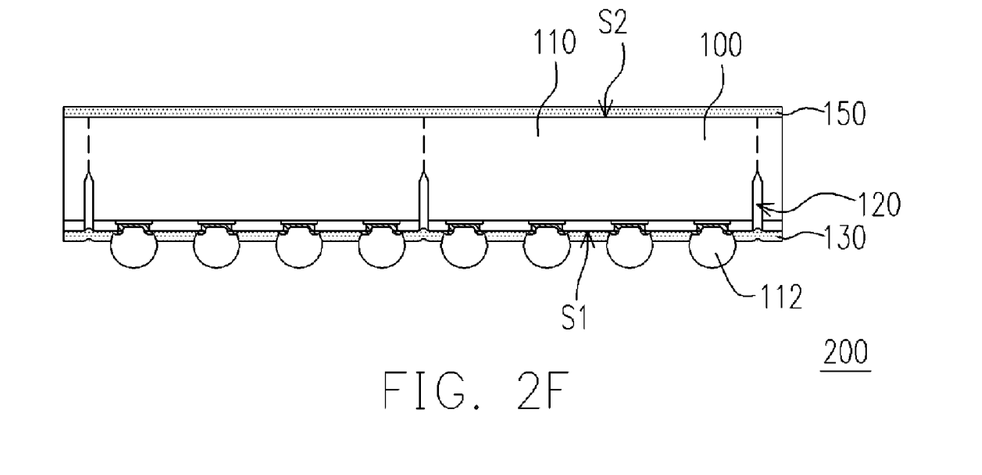

Continuing to FIG. 2F, the wafer structure 200 provided by the present invention mainly includes a wafer 100, a first curing-type protection layer 130 and a second curing-type protection layer 150. The wafer 100 has an active surface S1 and a corresponding reverse surface S2. On the active surface S1 a plurality of bumps 112 are disposed. The first curing-type protection layer 130 is disposed on the active surface S1 and the bumps 112 on the active surface S1 are exposed without being covered by the first curing-type protection layer 130. The second curing-type protection layer 150 is disposed on the reverse surface S2 of the wafer 100. The first curing-type protection layer 130 and the second curing-type protection layer 150 can be macromolecule material layers.

Figure 2G:
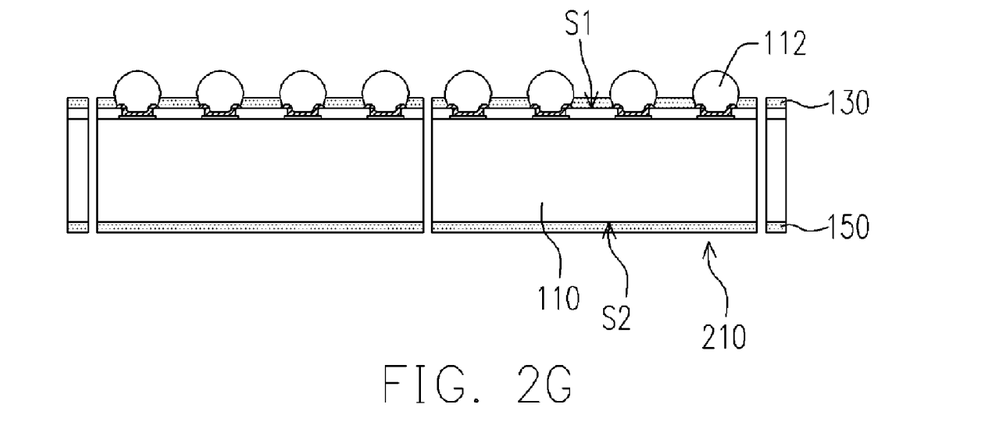

Continuing to FIG. 2G, the chip structure 210, formed after the wafer structure 200 is cut off, but not limited to this way by the present invention, remains in the intelligent property scope protected by the present invention.

To sum up, in the chip structure, the wafer structure and the fabricating method of wafer protection layers provided by the present invention, since two curing-type protection layers, for example, two curing-type macromolecule material layers are disposed on the active surface and the reverse surface of the wafer/chips, respectively, the defects in the chip process caused by dusting, polluting or scratching can be avoided, which contributes to enhance the chip production yield after packaging. In addition, for a single chip, there are also two supplemental advantages. A supplemental advantage of the first curing-type protection layer is it takes over the function for fixing and protecting the bumps originally performed by underfill of the prior art. While a supplemental advantage of the second curing-type protection layer is it takes over the function for protecting the chip originally performed by molding compound of the prior art, so that a single chip after cutting the wafer is able to directly be joined onto a carrier of a circuit board. Besides, the pellicle, for example the ultraviolet-curing pellicle, is used for making the bumps breach the curing-type protection layer and securing the curing-type protection layer to be adhered on the active surface of a chip.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A fabricating method of wafer protection layers, comprising:
   providing a wafer, the wafer comprises a plurality of chips and has an active surface, a corresponding reverse surface and a plurality of pre-cut trenches on the active surface, wherein a plurality of bumps are disposed on the active surface;
   disposing a first curing-type protection layer and a pellicle over and without contact the active surface, wherein the pellicle is used for enduring a laminating force but not as a part of the first curing-type protection layer;
   making the first curing-type protection layer contact the active surface;
   disposing a second curing-type protection layer on the reverse surface;
   curing the first curing-type protection layer and second curing-type protection layer; and
   cutting the wafer through the pre-cut trenches to separate the chips from the wafer.

2. The fabricating method of wafer protection layers as recited in claim 1, wherein the steps for disposing the first curing-type protection layer and the pellicle over the active surface comprise:
   disposing the first curing-type protection layer over the active surface; and
   disposing the pellicle on the first curing-type protection layer.

3. The fabricating method of wafer protection layers as recited in claim 1, wherein the steps for disposing the first curing-type protection layer and the pellicle over the active surface comprise:
   disposing the first curing-type protection layer on the pellicle; and
   disposing the first curing-type protection layer and the pellicle together over the active surface and making the first curing-type protection layer face the active surface.

4. The fabricating method of wafer protection layers as recited in claim 1, wherein, after making the first curing-type protection layer contact the active surface but prior to disposing the second curing-type protection layer, a step for removing the pellicle is further comprised.

5. The fabricating method of wafer protection layers as recited in claim 1, wherein the method for making the first curing-type protection layer contact the active surface comprises laminating the pellicle.

6. The fabricating method of wafer protection layers as recited in claim 1, wherein the material of the first curing-type protection layer and the second curing-type protection layer comprises acrylic nonconductive material.

7. The fabricating method of wafer protection layers as recited in claim 1, wherein the material of the first curing-type protection layer comprises transparent material.

8. The fabricating method of wafer protection layers as recited in claim 1, wherein the material of the first curing-type protection layer comprises opaque material.

9. The fabricating method of wafer protection layers as recited in claim 1, wherein the material of the first curing-type protection layer and the second curing-type protection layer comprises macromolecule material 10. The fabricating method of wafer protection layers as recited in claim 1, wherein the pellicle comprises an ultraviolet-curing pellicle.

11. The fabricating method of wafer protection layers as recited in claim 10, wherein, after making the first curing-type protection layer contact the active surface but prior to disposing the second curing-type protection layer, a step for ultraviolet-curing and removing the ultraviolet-curing pellicle is further comprised.

12. A fabricating method of wafer protection layers, comprising:
   providing a wafer, the wafer comprises a plurality of chips and has an active surface, a corresponding reverse surface and a plurality of pre-cut trenches on the active surface, wherein a plurality of bumps are disposed on the active surface;
   disposing a first curing-type protection layer and a pellicle over the active surface;
   making the first curing-type protection layer contact the active surface;
   disposing a second curing-type protection layer on the reverse surface;
   curing the first curing-type protection layer and second curing-type protection layer; and
   cutting the wafer through the pre-cut trenches to separate the chips from the wafer, wherein, after disposing the second curing-type protection layer but prior to curing the first curing-type protection layer and the second curing-type protection layer, a step for removing the pellicle is further comprised.

13. A fabricating method of wafer protection layers, comprising:

providing a wafer, the wafer comprises a plurality of chips and has an active surface, a corresponding reverse surface and a plurality of pre-cut trenches on the active surface, wherein a plurality of bumps are disposed on the active surface;

disposing a first curing-type protection layer and a pellicle over the active surface, wherein the pellicle comprises an ultraviolet-curing pellicle;

making the first curing-type protection layer contact the active surface;

disposing a second curing-type protection layer on the reverse surface;

curing the first curing-type protection layer and second curing-type protection layer; and cutting the wafer through the pre-cut trenches to separate the chips from the wafer, wherein, after disposing the second curing-type protection layer but prior to curing the first curing-type protection layer and the second curing-type protection layer, a step for ultraviolet-curing and removing the ultraviolet-curing pellicle is further comprised.

* * * * *